US010514427B2

(12) United States Patent
Pasqualetto (10) Patent No.: US 10,514,427 B2
(45) Date of Patent: Dec. 24, 2019

(54) METHOD FOR DETECTING A REVERSE CURRENT IN A SWITCHING STRUCTURE SUPPLYING AN INDUCTIVE LOAD

(71) Applicants: Continental Automotive France, Toulouse (FR); Continental Automotive GmbH, Hannover (DE)

(72) Inventor: Angelo Pasqualetto, Toulouse (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 0 days.

(21) Appl. No.: 16/470,384

(22) PCT Filed: Dec. 18, 2017

(86) PCT No.: PCT/FR2017/053650
§ 371 (c)(1),
(2) Date: Jun. 17, 2019

(87) PCT Pub. No.: WO2018/115682
PCT Pub. Date: Jun. 28, 2018

(65) Prior Publication Data
US 2019/0310323 A1 Oct. 10, 2019

(30) Foreign Application Priority Data
Dec. 20, 2016 (FR) ..................... 16 62850

(51) Int. Cl.
*G01R 31/02* (2006.01)
*G01R 31/40* (2014.01)
(Continued)

(52) U.S. Cl.
CPC ............. *G01R 31/40* (2013.01); *G01R 19/14* (2013.01)

(58) Field of Classification Search
CPC ........ G01R 31/02; G01R 31/31; G01R 31/32; G01R 31/40; G01R 19/00; G01R 19/14;
(Continued)

(56) References Cited

U.S. PATENT DOCUMENTS

| 5,644,484 A | 7/1997 | Elango | |
| 2011/0110002 A1* | 5/2011 | Ooshima | H02P 7/29 361/33 |

(Continued)

FOREIGN PATENT DOCUMENTS

DE 102016100438 A1 7/2016

OTHER PUBLICATIONS

International Search Report and Written Opinion for International Application No. PCT/FR2017/053650, dated Apr. 23, 2018—7 pages 2019.

(Continued)

*Primary Examiner* — Neel D Shah
(74) *Attorney, Agent, or Firm* — RatnerPrestia (57) ABSTRACT

A method for detecting a reverse current in a switching structure supplying power to an inductive load, having at least one switch and linked to an electric power source and to a ground for a control phase in which the current from the source supplies power to the load in accordance with a given duty cycle and a freewheeling phase in which the induced current from the load is decreasing, the reverse current being liable to be created during a freewheeling phase following a high duty cycle in a previous control phase creating a counter-electromotive force (cemf). The cemf is approximated proportionally to the integration of the duty cycle (integ[Dut cycl]) as a function of time (t), the reverse current either being calculated as a function of the estimated cemf or a reversal of the current criterion being established.

10 Claims, 4 Drawing Sheets

(51) Int. Cl.
   *G01R 19/00* (2006.01)
   *H02P 6/12* (2006.01)
   *G01R 19/14* (2006.01)
(58) Field of Classification Search
   CPC .......... H02P 6/12; H02P 27/06; H02P 29/024;
                                 H02P 29/027; H02P 29/032
   See application file for complete search history.

(56) References Cited

U.S. PATENT DOCUMENTS

2016/0211774 A1    7/2016  Degner et al.
2016/0352262 A1*  12/2016  Kataoka ................ H02P 29/032

OTHER PUBLICATIONS

English Translation of Written Opinion for International Application No. PCT/FR2017/053650, dated Apr. 23, 2018, 6 pages.

* cited by examiner

METHOD FOR DETECTING A REVERSE CURRENT IN A SWITCHING STRUCTURE SUPPLYING AN INDUCTIVE LOAD

CROSS REFERENCE TO RELATED APPLICATIONS

This application is the U.S. National Phase Application of PCT International Application No. PCT/FR2017/053650, filed Dec. 18, 2017, which claims priority to French Patent Application No. 1662850, filed Dec. 20, 2016, the contents of such applications being incorporated by reference herein.

FIELD OF THE INVENTION

The present invention relates to a method for detecting a reverse current in a switching structure supplying power to an inductive load. The switching structure, which comprises at least one power switch and is designed to drive a current in the load in accordance with a duty cycle, is linked firstly to an electric power source and secondly to a ground in order to control the inductive load.

SUMMARY OF THE INVENTION

Aspects of the present invention are applied preferably, but without limitation, in the automotive sector. Aspects of the present invention may be implemented for example in an electronic circuit incorporating a switching structure such as a transistor H-bridge. In the automotive industry, such an electronic circuit may be used to control the direction and/or the intensity of the electric current in inductive loads, such as for example electric motors.

The power supply for an inductive load, such as for example an electric motor, generally uses a switching structure, such as an H-bridge of switches, this not being limiting for aspects of the present invention.

Figure 1:
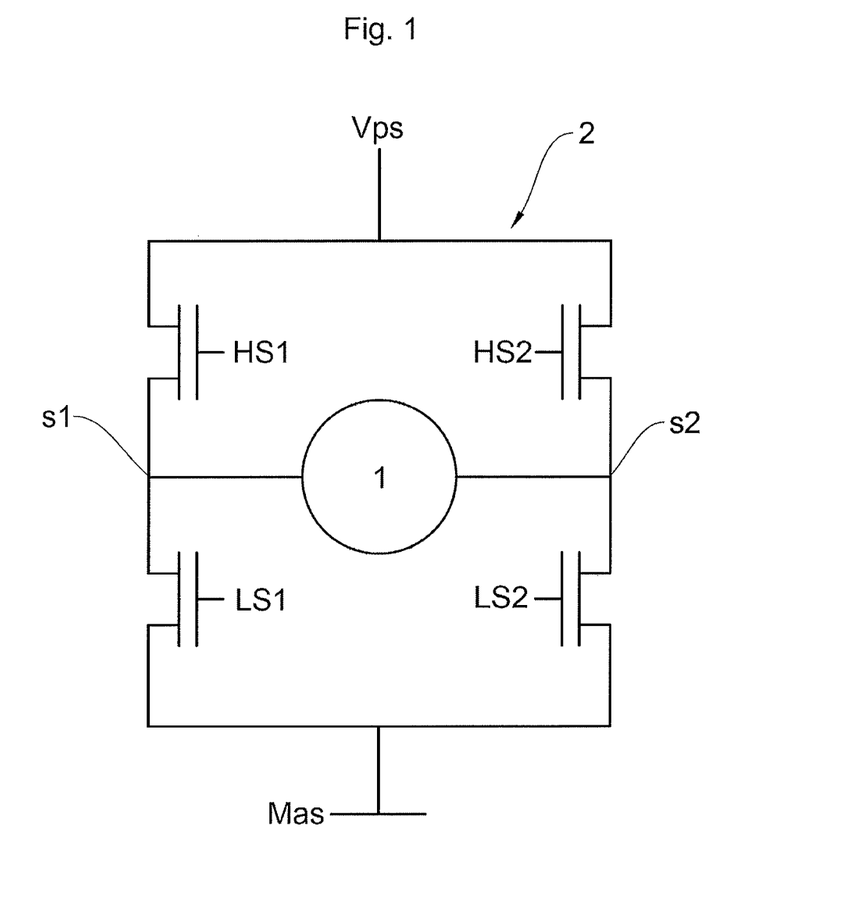
FIG. 1 is a schematic depiction of a perspective view of an H-bridge as switching structure, the method for detecting a reverse current according to an aspect of the present invention being able to be implemented using such a structure.

As shown in FIG. 1, an H-bridge as switching structure 2 for switching an inductive load 1 comprises four power switches HS1, HS2, HL1 and HL2, namely two "high-side" switches HS1, HS2 on the side of a positive power supply Vps, for example a battery producing a positive supply voltage, and two "low-side" switches LS1 and LS2 on the side of a negative power supply or ground Mas. Each switch generally comprises a power MOS transistor. The inductive load 1 is connected to the H-bridge by the outputs s1 and s2.

The amount of current injected into the inductive load, delivered by the switching circuit, is generally controlled by a sequence of analog control signals for controlling the four switches, produced from a setpoint control signal. The setpoint control signal and the analog control signals are generally pulse-width-modulated signals, also known under the acronym PWM.

By virtue of such a switching structure, the inductive load is able to be driven in both directions. The inductive load may also be controlled by chopping, so as to harness the current flowing through the inductive load.

Upon activation, the pair of forces in the inductive load generates an acceleration, which is angular in the case of an electric motor as load, the result of which is an angular or linear movement of the inductive load. The inductive load, under the effect of the movement, brings about a counter-electromotive force proportional to the angular or linear velocity of the inductive load. The inductive load is therefore able to be modeled by an inductance, a resistance and a voltage source, this being the counter-electromotive force opposing the supply voltage.

The control of the inductive load is formed of a control phase in which the current from the power source supplies power to the inductive load in accordance with a given duty cycle and a freewheeling phase in which the induced current from the inductive load is evacuated to ground. The flow direction of the current and the amount of current delivered in the inductive load are dependent on the duty cycle and on various combinations of states of the analog control signals.

A reverse current is liable to be created in the switching structure during a freewheeling phase following a high duty cycle in a previous control phase creating the counter-electromotive force in the inductive load.

During the freewheeling phase, that is to say when the two terminals of the motor are linked by the switching structure, for example an H-bridge, the supply voltage is no longer applied to the motor, and the only voltage source is the counter-electromotive force that is created. The inductance of the motor tends to keep the value of the current flowing through it, but the counter-electromotive force tends to reverse the direction of the current and effectively does so if its value is high enough and if the freewheeling time is relatively long.

Figure 3A:
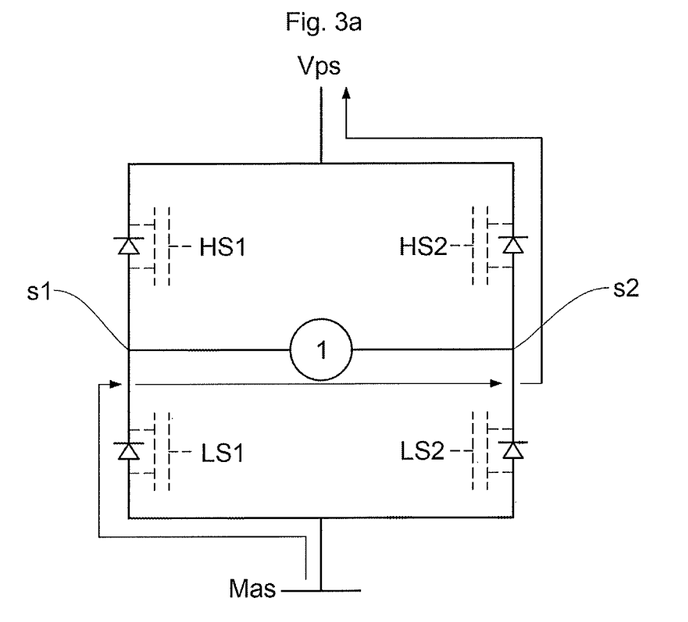
FIGS. 3*a* and 3*b* show the structural diodes of the switches of FIG. 1, through which the current imposed by the load flows during a dead time, that is to say just after a switching operation.
Figure 3B:
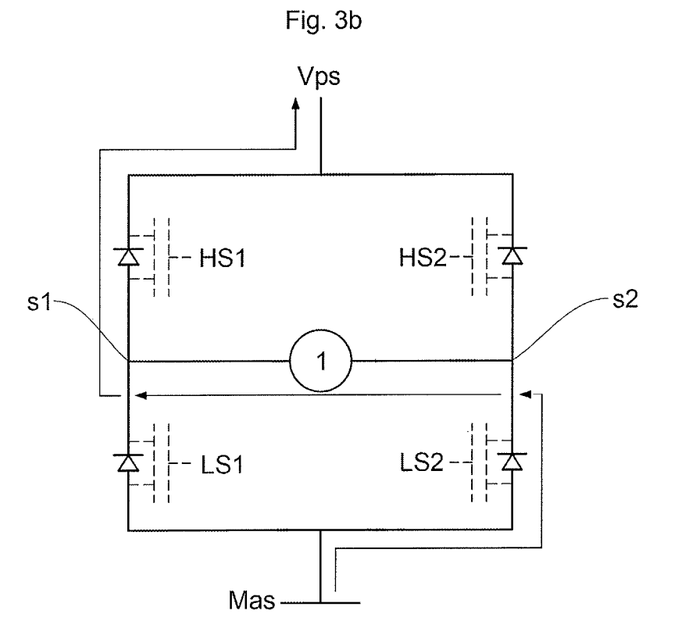

This reversal of the direction of the current with respect to the expected direction creates, during dead-time phases, recirculation of the current in the structural diodes of the switches. Specifically, in the switching structure, when chopping takes place, controlling the switches on the same side is avoided, that is to say, referring again to FIG. 1, switching HS1 and LS1 or else HS2 and LS2 at the same time is avoided and, by contrast, there is a passage through a phase in which the two switches are open. This phase is called dead time. FIGS. 3a and 3b pick up at FIG. 1 again by supplementing it with structural diodes of each of the switching transistors. During the dead-time phase, these diodes offer a path for the current. During the dead time, when the load 1 imposes a current direction from S1 to S2, as shown in FIG. 3a, the potential of the output S1 is slightly negative, and the potential of the output S2 is slightly higher than the potential Vps. During the dead time, when the load 1 by contrast imposes a current direction from S2 to S1, as shown in FIG. 3b, the potential of the output S2 is slightly negative, and the potential of the output S1 is slightly higher than the potential Vps. It is therefore possible to expect a slightly negative potential and to obtain a potential slightly above Vps, and vice versa, when the current reverses under the effect of the counter-electromotive force.

This effect may be disruptive in some diagnoses. It is for this reason that it is advantageous for driving software to recognize cases of potential reversal of the current.

The problem underlying the present invention is that of detecting a current reversal in a switching structure intended to drive an inductive load using DC current during a freewheeling phase in the switching structure.

To this end, an aspect of the invention relates to a method for detecting a reverse current in a switching structure supplying power to an inductive load, the switching structure comprising at least one power switch and being designed to drive a current in the load in accordance with a duty cycle, the switching structure being linked firstly to an electric power source and secondly to a ground in order to control the inductive load, the method involving a control phase in which the current from the power source supplies power to the inductive load in accordance with a given duty cycle and a freewheeling phase in which the induced current from the inductive load is decreasing, the reverse current being liable to be created in the switching structure during a freewheeling phase following a high duty cycle in a previous control phase creating a counter-electromotive force in the inductive load. The method is noteworthy in that the counter-electromotive force at a given instant is approximated as being substantially proportional to the integration of the duty cycle as a function of time, the reverse current either being calculated as a function of the estimated counter-electromotive force or a reversal of the current criterion being established.

The technical effect that is obtained is that of establishing a diagnosis of reverse current in a simple manner by using an approximation that is not strictly exact. The approximation that is made is that of considering that the counter-electromotive force is similar to the integration of the duty cycle over time. It is then possible, knowing the counter-electromotive force, to calculate the reverse current or to establish a reversal criterion that is less accurate than the calculation of the reverse current but easier to implement.

Advantageously, the approximation of the counter-electromotive force is calibrated with respect to the inductive load, and a coefficient of integration for the duty cycle is defined. As the method according to an aspect of the present invention is based on an approximation, it is advantageous to modify the integration of the duty cycle as a function of time in order to bring it closer to the counter-electromotive force.

Advantageously, an integration of the duty cycle of rank n: integ[Dut cycl(n)] is defined by an integration of the previous duty cycle of rank n−1: integ[Dut cycl(n−1)] and by the duty cycle of rank n dut cycl(n) according to the following equation, a being the coefficient of integration, between 0 and 1:

Integ[Dut cycl($n$)]=$a$·integ[Dut cycl($n-1$)]+$(i-a)$·dut cycl($n$)

The first element of the series Integ[Dut cycl(n)] is zero, that is to say that:

Integ[Dut cycl(0)]=0

It is noted that the duty cycle is signed, that is to say that the direction corresponds to the sign and that Dut cycl(n) therefore varies between −1 and +1.

For example, the coefficient of integration a may be equal to 0.8 and a temporal granularity of 5 milliseconds for the integration of the duty cycle may be defined, and it is possible to start with −50% duty cycle for 40 ms before applying +50% duty cycle.

Advantageously, when a reversal of the current criterion is established, a gradient limit p on a curve of the integration of the duty cycle is estimated and a limit value b corresponding to the gradient limit for a temporal granularity g is set according to the equation:

$b=p\cdot g$ a current reversal criterion in relation to a difference between the integration of the duty cycle of rank n: Integ[Dut cycl(n)] and the integration of the duty cycle of rank n−1: integ[Dut cycl(n−1)] is then defined, and
when this difference is less than: −b for an integration of the positive duty cycle, that is to say:

Integ[Dut cycl($n$)]−integ[Dut cycl($n-1$)]<−$b$ or when this difference is greater than +b for an integration of the negative duty cycle, that is to say:

Integ[Dut cycl($n$)]−Integ[Dut cycl($n-1$)]>+$b$ it is estimated that a current reversal is effective.

Advantageously, the limit b is able to be calibrated in accordance with the selected temporal granulometry and in accordance with the inductive load that is used as well as the frequency of the signal of a pulse width modulation.

Advantageously, when the reverse current I is calculated, this calculation is performed based on an average current expressed as a function of the estimated counter-electromotive force cemf, of the measured voltage of the power source Vps, of the duty cycle dut cycl and of the resistance of the circuit R according to the following equation:

$I$average=(dut cycl·$Vps$−cemf)/$R$

An aspect of the invention also relates to an assembly of an inductive load and its electric power supply device, the power supply device comprising a switching structure comprising at least one power switch and being associated with a control unit comprising means for driving a current in the load in accordance with a pulse width modulation duty cycle, the switching structure being linked firstly to an electric power source and secondly to a ground, characterized in that the assembly implements such a method for detecting a reverse current in the switching structure, the control unit comprising means for integrating the duty cycle, means for approximating a counter-electromotive force as a function of the integration of the duty cycle, means for calculating the reverse current from the approximation of the counter-electromotive force or means for detecting a current reversal as a function of a reversal criterion kept in memory means of the control unit, the control unit also comprising means for transmitting current reversal information.

Advantageously, the switching structure is an H-bridge.

BRIEF DESCRIPTIONS OF THE DRAWINGS

Details and advantages of aspects of the present invention will become more clearly apparent from the following description, given with reference to the appended schematic drawing, in which.

DETAILED DESCRIPTION OF THE PREFERRED EMBODIMENTS

Figure 2:
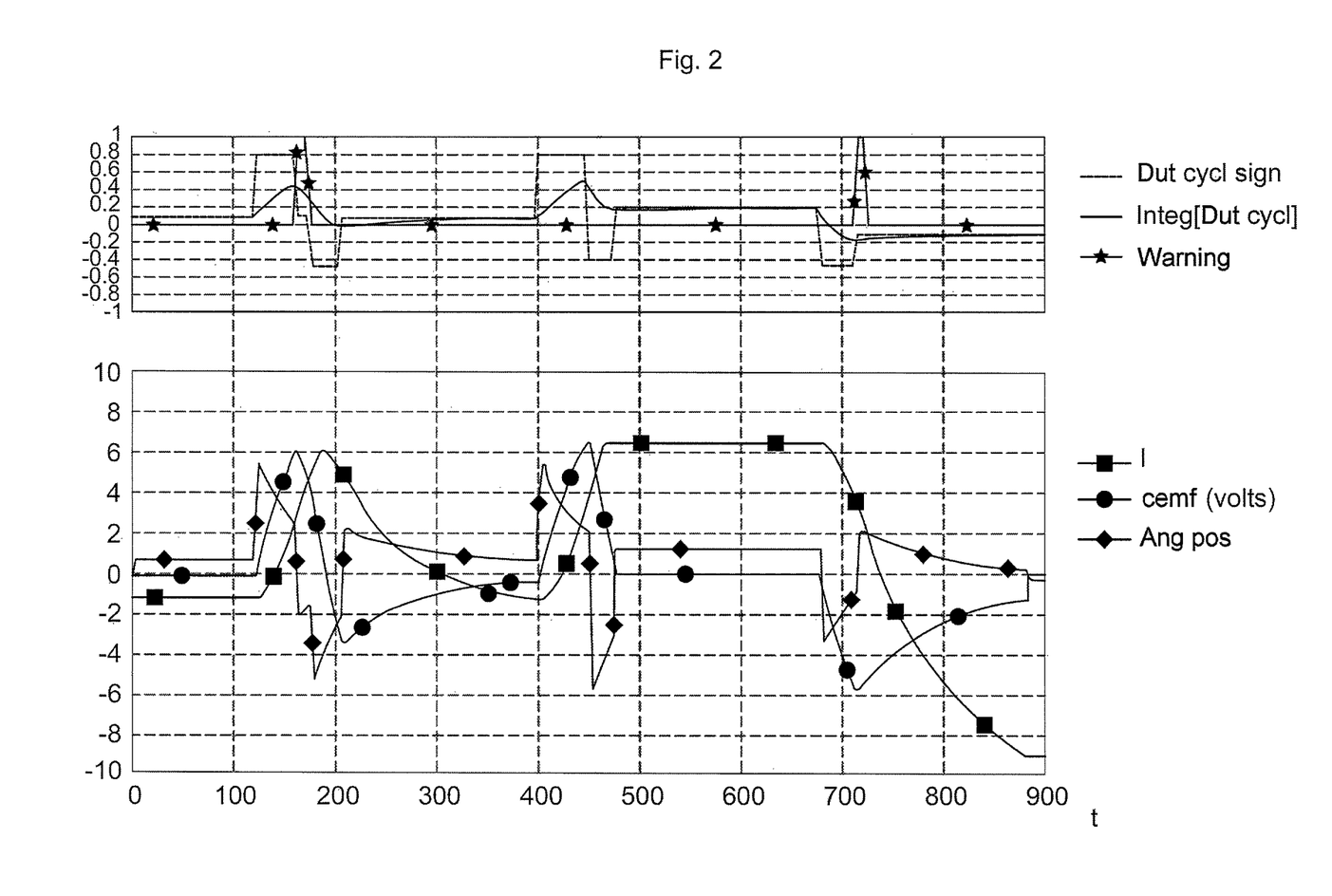
FIG. 2 is a timing diagram including two groups of various curves, the upper group of curves being formed of a signed duty cycle curve, of a warning curve and of an integration of the duty cycle curve, whereas the lower group of curves is formed of a current intensity curve, of a counter-electromotive force curve and of an angular position curve, the counter-electromotive force being approximated as a function of the integration of the duty cycle in the method according to an aspect of the present invention.

With reference to FIGS. 1 and 2, an aspect of the present invention relates to a method for detecting a reverse current in a switching structure 2 supplying power to an inductive load 1. The inductive load 1 may advantageously be an electric motor, more particularly a DC-current electric motor.

FIG. 1, which has already been described in the introductory part of the present application, relates to an H-bridge, which is one preferred but nonlimiting form of implementation of the switching structure 2 implemented in the context of an aspect of the present invention. Such an H-bridge is known from the prior art.

Generally speaking, the switching structure 2 comprises at least one power switch HS1, HS2, LS1, LS2 and is designed to drive a current in the load in accordance with a duty cycle. The switching structure 2 is linked firstly to an electric power source, referenced Vps in FIG. 1, and secondly to a ground Mas.

The switching structure 2 makes it possible to perform control of the inductive load 1 that is formed of a control phase in which the current from the power source Vps supplies power to the inductive load 1 and a freewheeling phase in which the current is generated by the inductive load 1. The current increases during the control phase and decreases during the freewheeling phase. An average current is proportional to the duty cycle, which corresponds to the duration of the control phase divided by the period.

As mentioned above, a reverse current is liable to be created in the switching structure 2 during a freewheeling phase following a previous duty cycle that created a counter-electromotive force cemf in the inductive load 1.

According to an aspect of the invention, and with reference more particularly to FIG. 2, the counter-electromotive force cemf at a given instant is approximated as being substantially proportional to the integration of the duty cycle integ[Dut cycl] as a function of time t. The reverse current is then calculated as a function of the estimated counter-electromotive force cemf or a reversal of the current criterion is established.

FIG. 2 shows two groups of three curves as a function of a time t. The upper curves in FIG. 2 are an integration of duty cycle curve, referenced integ[Dut cycl] and illustrated by a curve in an unbroken line, a signed duty cycle curve, that is to say with the indication of the direction of the duty cycle, the sign representing the control direction, referenced dut cycl sign and illustrated by a curve in dashed lines. Lastly, the third curve is a curve of transmission of a warning signal representative of a potentially reverse current, referenced Warning and illustrated by a curve with stars.

The lower curves in FIG. 2 are a curve of intensity I of the average current expressed in amperes, illustrated by a curve with squares, a counter-electromotive force cemf curve expressed in volts, referenced cemf and illustrated by a curve with circles. The third curve is an angular position of the inductive load 1 curve, referenced Angl pos and illustrated by a curve with diamonds.

In FIG. 2, it is able to be seen that the integration of duty cycle curve, referenced integ[Dut cycl], is similar to the counter-electromotive force curve cemf. This similarity between the two curves may be boosted through calibration by choosing the coefficient of integration a for the duty cycle.

However, this approximation is not exact and cannot actually be considered to be an equality between the integration of duty cycle curve integ[Dut cycl] and the counter-electromotive force curve cemf. Considering that the average current depends linearly on the duty cycle and on the counter-electromotive force, which is quite justified, a set of equations is obtained:

$$Iaverage(t)=\alpha \cdot dut\_cycl(t)-\beta \cdot cemf(t)$$

$$cemf(t)=k \cdot velocity(t)$$

$$velocity(t)=\int_0^t acceleration(t) \cdot dt$$

$$acceleration(t)=\gamma \cdot Iaverage(t)$$

$$\Rightarrow cemf(t)=k \cdot \alpha \cdot \gamma \cdot \int_0^t dut\_cycl(t) \cdot dt - k \cdot \beta \cdot \gamma \cdot \int_0^t cemf(t) \cdot dt$$

The final relationship results in a differential equation that features constants $\alpha$, $\beta$, $\gamma$, k, and not in an integration of the duty cycle Integ[Dut cycl] in accordance with the following equation, with $\lambda$ being a constant:

$$\Rightarrow cemf(t)=\lambda \cdot \int_0^t dut\_cycl(t) \cdot dt$$

as this assumes that the coefficient $\beta$ is canceled out, which is not true. This is however tantamount to this approximation, and sampling will make it possible to obtain a satisfactory result despite this mathematical inaccuracy.

In the absence of a counter-electromotive force cemf, the current I is proportional to the duty cycle. The counter-electromotive force cemf is proportional to the angular velocity, which is deduced by integrating the acceleration. As the acceleration is proportional to the current I, the counter-electromotive force cemf would be proportional to the integration of the duty cycle integ[Dut cycl] if the counter-electromotive force cemf were to be zero, which is not the case and therefore limits the approximation.

This demonstrates a relationship with the integration of the duty cycle integ[Dut cycl] and at the same time the impossibility of strict proportionality with this integration, since the counter-electromotive force cemf reduces the current I.

This involves adjusting the integration of duty cycle curve integ[Dut cycl] so as to create a signal that resembles that of the counter-electromotive force cemf as closely as possible. This may be performed by adjusting the level of integration for a maximum resemblance to the counter-electromotive force cemf. It is therefore necessary to first of all calibrate the simulation model to the electric motor under consideration and then to dose a coefficient of integration.

It is for this reason that calibration and a coefficient of integration are necessary to correct the integration of duty cycle curve integ[Dut cycl]. However, it may be considered that this approximation is enough to give a valid estimation of the counter-electromotive force cemf.

In FIG. 2, the current I curve has passed through the axis of zero current without the direction of the duty cycle having changed, therefore with one and the same sign of the signed duty cycle dut cycl sign. This reflects a current I reversal.

In the middle of the current I curve, taking the scale of the time t as reference, the current I changes direction but in accordance with the change of sign of the control duty cycle dut cycl sign. In this case here, there is no reversal of the current with respect to the expected direction.

In a first preferred embodiment of an aspect of the present invention, an integration of the duty cycle of rank n: integ[Dut cycl(n)] is defined by an integration of the previous duty cycle of rank n−1: integ[Dut cycl(n−1)] and by the duty cycle of rank n: dut cycl(n) according to the following equation, a being the coefficient of integration:

$$Integ[Dut\ cycl(n)]=a \cdot integ[Dut\ cycl(n-1)]+(1-a) \cdot dut\ cycl(n)$$

For example, the coefficient of integration a may be equal to 0.8 and a temporal granularity of 5 milliseconds for the integration of the duty cycle is defined, and we start with −50% duty cycle for 40 ms before applying +50% duty cycle.

For this example, the series that is obtained, for the first elements, is:

|  | Time | | | | | | | | | | | | |
|---|---|---|---|---|---|---|---|---|---|---|---|---|---|
|  | 0 | 5 ms | 10 ms | 15 ms | 20 ms | 25 ms | 30 ms | 35 ms | 40 ms | 45 ms | 50 ms | 55 ms | 60 ms |
| n | 0 | 1 | 2 | 3 | 4 | 5 | 6 | 7 | 8 | 9 | 10 | 11 | 12 |
| Dut cycl(n) | −0.5 | −0.5 | −0.5 | −0.5 | −0.5 | −0.5 | −0.5 | −0.5 | −0.5 | +0.5 | +0.5 | +0.5 | +0.5 |
| Integ[Dut cycl(n)] | 0 | −0.1 | −0.18 | −0.24 | −0.3 | −0.34 | −0.37 | −0.4 | −0.22 | −0.07 | 0.04 | 0.13 | 0.21 |

When a reversal of the current criterion is established, a gradient p on a curve of the integration of the duty cycle integ[Dut cycl(n)] may be estimated and a limit b on the slope for a temporal granularity g may be set according to the equation:

$$b = p \cdot g$$

A current reversal criterion in relation to a difference between the integration of the duty cycle of rank n integ[Dut cycl(n)] and the integration of the duty cycle of rank n−1 integ[Dut cycl(n−1)] may then be defined.

When this difference is less than −b for an integration of the positive duty cycle, that is to say:

$$\text{Integ}[\text{Dut cycl}(n)] - \text{Integ}[\text{Dut cycl}(n-1)] < -b$$

or when this difference is greater than +b for an integration of the negative duty cycle, that is to say:

$$\text{Integ}[\text{Dut cycl}(n)] - \text{Integ}[\text{Dut cycl}(n-1)] > +b$$

it is estimated that a current reversal is effective.

The limit b may be able to be calibrated in accordance with the selected temporal granulometry and in accordance with the inductive load that is used as well as the frequency of the signal of a pulse width modulation.

In a second preferred mode of an aspect of the present invention, in which reverse current I is calculated, this calculation is performed based on a current expressed as a function of the estimated counter-electromotive force cemf, of the measured voltage of the power source Vps, of the duty cycle dut cycl and of the resistance of the circuit R according to the following equation:

$$I_{average} = (\text{dut cycl} \cdot V_{ps} - \text{cemf})/R$$

For a positive duty cycle, the minimum current is obtained by subtracting an estimated margin obtained by calibration.

For a negative duty cycle, the maximum current is obtained by adding an estimated margin obtained by calibration.

The current I is said to be reverse when it changes direction without the duty cycle changing direction. This change of direction is detected by a negative minimum current when the duty cycle is positive, or a positive maximum current when the duty cycle is negative.

This expression in fact gives an average current. When this is close enough to 0, there may be a reversal of the current direction at the end of freewheeling. To ascertain the current at any time, it would be necessary to perform a far less simple calculation, described below.

By using a period, where t0 is the time at the beginning of the period, the equation for the current at activation is:

$$I(t) = \frac{V_{ps} - \text{cemf}}{R} \cdot \left(1 - e^{\frac{-(t-t0)}{\tau}}\right)$$

where $\tau$ is the time constant obtained by dividing the inductance of the load by the total resistance of the circuit.

During the freewheeling phase, based on the time t1=t0+ dut cycl·period, the equation for the current is:

$$I(t) = \left(\frac{V_{ps} - \text{cemf}}{R} \cdot \left(1 - e^{\frac{-(t1-t0)}{\tau}}\right) + \frac{\text{cemf}}{R}\right) \cdot e^{\frac{-(t-t1)}{\tau}} - \frac{\text{cemf}}{R}$$

The current thus adopts its minimum value at the time t2, at the end of the freewheeling phase.

$$t2 = t0 + \text{period}$$

$$I \text{ minimum} = \left(\frac{V_{ps} - \text{cemf}}{R} \cdot \left(1 - e^{\frac{-(t1-t0)}{\tau}}\right) + \frac{\text{cemf}}{R}\right) \cdot e^{\frac{-(t2-t1)}{\tau}} - \frac{\text{cemf}}{R}$$

The average current is obtained mathematically by integrating the current over a period. The result is the expression already given above:

$$I_{average} = (\text{dut cycl} \cdot V_{ps} - \text{cemf})/R$$

Three ways of using the counter-electromotive force value emerge:

The first one is performed using an accurate calculation according to the formula:

$$I \text{ minimum} = \left(\frac{V_{ps} - \text{cemf}}{R} \cdot \left(1 - e^{\frac{-(t1-t0)}{\tau}}\right) + \frac{\text{cemf}}{R}\right) \cdot e^{\frac{-(t2-t1)}{\tau}} - \frac{\text{cemf}}{R} *$$

The second one is performed using a simplified calculation using:

$$I_{average} = (\text{dut cycl} \cdot V_{ps} - \text{cemf})/R$$

and a current margin corresponding to the estimated difference between the average current and the minimum current.

The third one results from a comparison on the gradient of the counter-electromotive force.

The last two ways are advantageous for greater ease of calculation. As the value of the counter-electromotive force is dependent on the load, it is necessary in any case to proceed using calibration, and the calibration is liable to compensate approximations in the formulae.

With reference to FIGS. 1 and 2, an aspect of the invention also relates to an assembly of an inductive load 1 and its electric power supply device, the power supply device comprising a switching structure 2 comprising at least one power switch HS1, HS2, LS1, LS2 and being associated with a control unit comprising means for driving a current in the load in accordance with a pulse width modulation duty cycle. That is to say that an aspect of the invention relates to H-bridges, half H-bridges and even to simple switches associated with a recirculation diode.

Figure 4A:
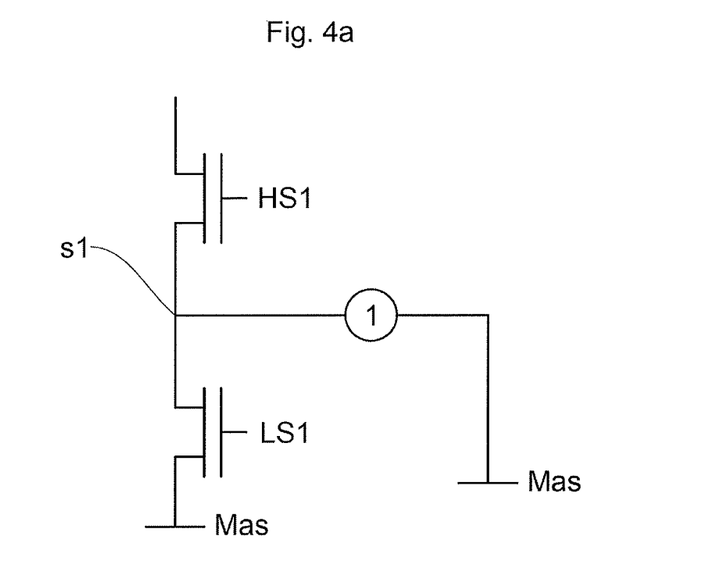
FIGS. 4*a* and 4*b* show further compatible switching structures of an aspect of the invention, respectively as a half-bridge for FIG. 4*a* and as a simple switching operation for FIG. 4*b*.
Figure 4B:
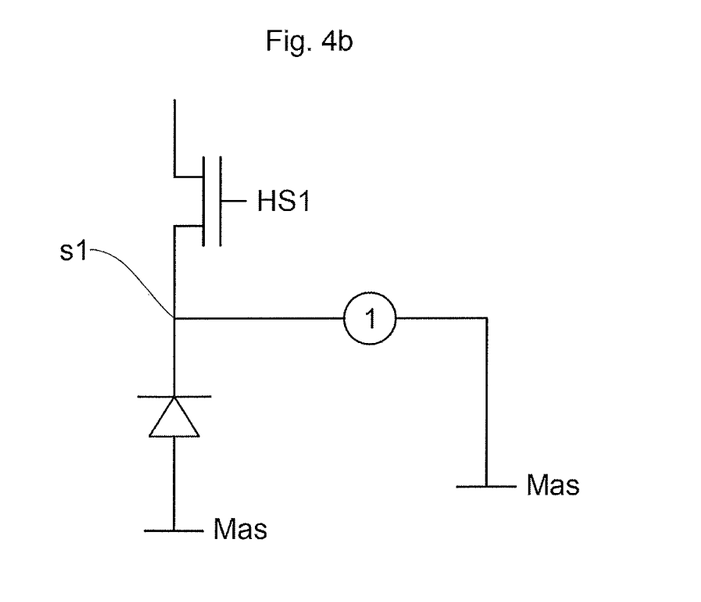

For example and without limitation, FIGS. 4a and 4b show further compatible switching structures of an aspect of the invention, respectively as a half-bridge for FIG. 4a and as a simple switching operation for FIG. 4b.

The switching structure 2 is linked firstly to an electric power source Vps and secondly to a ground Mas.

The assembly implements a method for detecting a reverse current in the switching structure 2 as mentioned above. The control unit comprises means for integrating the duty cycle integ[Dut cycl], means for approximating a counter-electromotive force cemf as a function of the integration of the duty cycle integ[Dut cycl], means for calculating the reverse current from the approximation of the counter-electromotive force cemf or means for detecting a current reversal as a function of a reversal criterion kept in memory means of the control unit, the control unit also comprising means for transmitting current reversal information, in accordance with the signal referenced warning in the upper part of FIG. 2.

The invention claimed is:

1. A method for detecting a reverse current in a switching structure supplying power to an inductive load, the switching structure comprising at least one power switch and being designed to drive a current in the load in accordance with a duty cycle, the switching structure being linked firstly to an electric power source (Vps) and secondly to a ground (mas) in order to control the inductive load, the method comprising a control phase in which the current from the power source (Vps) supplies power to the inductive load in accordance with a given duty cycle and a freewheeling phase in which the induced current from the inductive load is decreasing, the reverse current being liable to be created in the switching structure during a freewheeling phase following a high duty cycle in a previous control phase creating a counter-electromotive force (cemf) in the inductive load t, wherein the counter-electromotive force (cemf) at a given instant is approximated as being substantially proportional to an integration of the duty cycle (integ[Dut cycl]) as a function of time, the reverse current either being calculated as a function of an estimated counter-electromotive force (cemf) or a reversal of a current criterion being established.

2. The method as claimed in claim 1, wherein the approximation of the counter-electromotive force (cemf) is calibrated with respect to the inductive load, and a coefficient of integration for the duty cycle is defined.

3. The method as claimed in claim 2, wherein an integration of the duty cycle of rank n integ[Dut cycl(n)] is defined by an integration of the previous duty cycle of rank n−1: integ[Dut cycl(n−1)] and by the duty cycle of rank n dut cycl(n) according to the following equation, a being the coefficient of integration:

Integ[Dut cycl($n$)]=$a$·integ[Dut cycl($n$−1)]+(1−$a$)·dut cycl($n$).

4. The method as claimed in claim 3, wherein, when a reversal of the current criterion is established, a gradient limit p on a curve of the integration of the duty cycle (integ[Dut cycl]) is estimated and a limit value b corresponding to the gradient limit for a temporal granularity g is set according to the equation:

$b=p·g$ a current reversal criterion in relation to a difference between the integration of the duty cycle of rank n integ·Dut cycl (n) and the integration of the duty cycle of rank n−1: integ[Dut cycl(n−1)] is then defined, and when this difference is less than −b for an integration of the positive duty cycle, that is to say:

Integ[Dut cycl($n$)]−integ[Dut cycl($n$−1)]<−$b$ or when this difference is greater than +b for an integration of the negative duty cycle, that is to say:

Integ[Dut cycl($n$)]−integ[Dut cycl($n$−1)]>+$b$ it is estimated that a current reversal is effective.

5. The method as claimed in claim 4, wherein the limit b is able to be calibrated in accordance with the selected temporal granulometry and in accordance with the inductive load that is used as well as the frequency of the signal of a pulse width modulation.

6. The method as claimed in claim 2, wherein, when the reverse current I is calculated, this calculation is performed based on a current expressed as a function of the estimated counter-electromotive force cemf, of the measured voltage of the power source Vps, of the duty cycle dut cycl and of the resistance of the circuit R according to the following equation:

$I$=(dut cycl·$Vps$−cemf)/$R$.

7. The method as claimed in claim 3, wherein, when the reverse current I is calculated, this calculation is performed based on a current expressed as a function of the estimated counter-electromotive force cemf, of the measured voltage of the power source Vps, of the duty cycle dut cycl and of the resistance of the circuit R according to the following equation:

$I$=(dut cycl·$Vps$−cemf)/$R$.

8. The method as claimed in claim 1, wherein, when the reverse current I is calculated, this calculation is performed based on a current expressed as a function of the estimated counter-electromotive force cemf, of the measured voltage of the power source Vps, of the duty cycle dut cycl and of the resistance of the circuit R according to the following equation:

$I$=(dut cycl·$Vps$−cemf)/$R$.

9. An assembly of an inductive load and its electric power supply device, the power supply device comprising a switching structure comprising at least one power switch and being associated with a control unit comprising means for driving a current in the load in accordance with a pulse width modulation duty cycle, the switching structure being linked firstly to an electric power source (Vps) and secondly to a ground (mas), wherein the assembly implements a method for detecting a reverse current in the switching structure as claimed in claim 1, the control unit comprising means for integrating the duty cycle (integ[Dut cycl]), means for approximating a counter-electromotive force (cemf) as a function of the integration of the duty cycle (integ[Dut cycl]), means for calculating the reverse current from the approximation of the counter-electromotive force (cemf) or means for detecting a current reversal as a function of a reversal criterion kept in memory means of the control unit, the control unit also comprising means for transmitting current reversal information.

10. The assembly as claimed in claim 9, wherein the switching structure is an H-bridge.

* * * * *